Dec. 6, 1960
J. G. MAVROIDES ET AL
2,962,797
POWER TRANSISTORS
Filed March 12, 1957
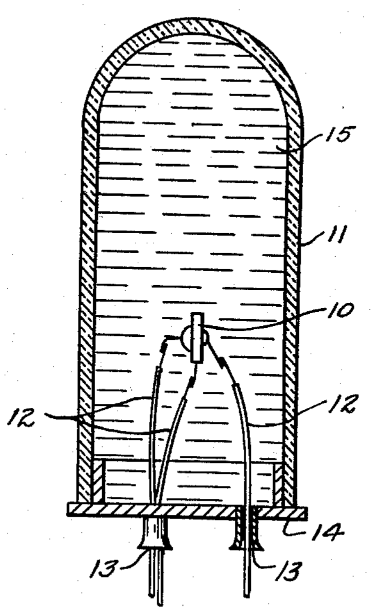
INVENTOR.
JOHN G. MAVROIDES
SEYMOUR SCHWARTZ
BY Wade Koontz
ATTORNEY
Richard J. Killoran
AGENT

United States Patent Office 2,962,797

Patented Dec. 6, 1960

2,962,797

POWER TRANSISTORS

John G. Mavroides, Waltham, and Seymour Schwartz, Revere, Mass., assignors to the United States of America as represented by the Secretary of the Air Force Filed Mar. 12, 1957, Ser. No. 645,648

6 Claims. (Cl. 29—25.3)

This invention relates to power transistors and the method of making the same from available low power handling capacity transistors.

The main object of the invention is to produce transistors capable of dissipating D.C. power up to one-half watt without exceeding the temperature limitation of the transistor unit.

Another object is to produce transistors capable of dissipating D.C. power up to one-half watt without increasing the transistor dimensions.

These and other objects will be understood more clearly by reference to the following detailed description of the invention.

The drawing shows a vertical section of a power transistor of the invention.

In connection with the design of a transistorized receiver, the need arose for a power transistor capable of dissipating D.C. power of the order of 200 milliwatts with a safety factor of 2.5. Therefore, a power transistor capable of dissipating D.C. power up to 500 milliwatts was required.

Since no transistors of this power handling capacity were available, it was necessary to modify existing transistors to handle the required power. Two types of junction transistors are easily available. They are: the fused p-n-p transistor and the grown n-p-n transistor. These transistors are generally operated below 70° C. This temperature limitation is inherent in the width of the energy gap of the germanium material. As the temperature increases, enough electrons are transferred from the valence band to the conduction band to turn the impurity semiconductor into intrinsic semiconductor. Also, the p-n-p fused transistor must be operated fairly below the melting point of indium, the impurity in the p-type germanium, which is 155° C.

The problem was threefold, first the transistor unit had to be uncased without injuring it, then the bare units had to be cleaned and finally the units had to be recased and the case had to be filled with a cooling medium.

The transistors were removed from the plastic casings by heating the units to 70° C. first in glacial acetic acid and then in toluene. Some units were obtained without the casings, thereby making this step unnecessary.

The bare units were cleaned first with water, from which the impurities had been removed by double distillation. The units were then cleaned further with alcohol and finally with carbon tetrachloride. It was found that some transistors that had deteriorated could be restored by cleaning the surface in this manner. Others required a 1½ minute anodic etch of the junctions in sodium hydroxide to be restored. It was impossible to repair fused transistors in which the emitter and collector junctions had shorted to one another.

After the transistor units were cleaned, they were ready to be cased. Referring now to the drawing, a transistor 10 is supported within a glass envelope 11 by means of leads 12. The leads are passed through openings 13 in a metal support 14. A glass to metal seal is provided between the envelope 11 and the support 14.

The tube was filled with a coolant 15 by passing the coolant through a hypodermic needle which had been inserted in one of the lead wire openings 13. If the lead wires 12 do not completely fill the openings 13, the opening should be sealed to prevent seepage of the liquid.

The cooling liquids used were carbon tetrachloride and silicon oil Type DC 550. Both cooling liquids seemed adequate, but carbon tetrachloride was found to have a tendency to seep through any slight defect in the seal.

There is thus provided a method of modifying available low power handling transistors to produce power transistors capable of dissipating power up to one-half watt.

We claim:

1. The method of modifying an uncased low power-handling transistor to produce half-watt power transistor comprising the steps of: cleaning the unit first with doubly distilled water, then with alcohol and finally with carbon tetrachloride, mounting the unit in a glass tube, filling the tube with a cooling liquid and sealing the opening through which the cooling liquid was supplied.

2. The method of producing high power-handling transistors comprising the steps of: removing the casing of an available low power handling transistor by heating the unit to 70° C. first in glacial acetic acid and then in toluene, cleaning the transistor unit successively in doubly distilled water, alcohol and carbon tetrachloride, mounting the transistor unit on a support, inserting the transistor unit in a glass tube, providing a seal between the support and glass tube, filling the glass tube with a cooling liquid and sealing the opening through which the cooling liquid has been supplied.

3. The method of modifying low power handling transistors to produce half-watt power transistors comprising the steps of: removing the casing of the transistor by heating the unit to 70° C. first in glacial acetic acid and then in toluene, cleaning the unit successively with doubly distilled water, alcohol and carbon tetrachloride, mounting the unit in a glass tube, inserting a cooling liquid into the tube by means of a hypodermic needle, sealing the opening through which the cooling liquid has been supplied.

4. The method of producing transistors with high power handling capacity comprising the steps of cleaning an uncased transistor unit successively with doubly distilled water, alcohol and carbon tetrachloride, mounting the transistor unit on a metal support with holes therein for the transistor leads, inserting the transistor unit within a glass tube, providing a glass to metal seal between the glass tube and the metal support, inserting a cooling liquid in the tube by means of a hypodermic needle inserted into one of the holes in the metal support, sealing the hole through which the cooling liquid has been supplied.

5. The method of producing transistors with high power handling capacity from deteriorated low power handling transistors comprising the steps of removing the casing of the transistor by heating the unit to 70° C. first in glacial acetic acid and then in toluene, cleaning the unit successively with doubly distilled water, alcohol and carbon tetrachloride, anodically etching the junctions of the transistor in sodium hydroxide, mounting the unit in a glass tube inserting a cooling liquid into the tube by means of a hypodermic needle, sealing the opening through which the cooling liquid has been supplied.

6. The method of producing transistors with high power handling capacity from deteriorated low power handling transistors comprising the steps of removing the casing of the transistor by heating the unit to 70° C. first in glacial acetic acid and then in toluene, cleaning the unit successively with doubly distilled water, alcohol and carbon tetrachloride, inserting the insulated leads of the transistor unit into holes in a metal base and thereby provide a support for said unit, inserting the transistor unit within a glass tube, providing a glass to metal seal between the glass tube and the metal base, inserting a cooling liquid into the tube by means of a hypodermic needle passed through one of the lead holes in the metal base and sealing the hole through which the cooling liquid has been supplied.

References Cited in the file of this patent

UNITED STATES PATENTS

| | | |
|---|---|---|
| 2,122,117 | Stringer | June 28, 1938 |
| 2,441,353 | Gosmann et al. | May 11, 1948 |
| 2,731,704 | Sponds | Jan. 24, 1956 |
| 2,757,439 | Burns | Aug. 7, 1956 |
| 2,768,100 | Rulison | Oct. 23, 1956 |
| 2,787,744 | Brock et al. | Apr. 2, 1957 |
| 2,810,870 | Hunter et al. | Oct. 22, 1957 |
| 2,812,480 | Ellis | Nov. 5, 1957 |
| 2,832,702 | Svchwartz | Apr. 29, 1958 |